(12) United States Patent
Schick et al.

(10) Patent No.: US 10,292,278 B2
(45) Date of Patent: May 14, 2019

(54) COMPACT PRINTED CIRCUIT BOARD ASSEMBLY WITH INSULATING ENDCAP VIA

(71) Applicant: Seagate Technology LLC, Cupertino, CA (US)

(72) Inventors: Thomas Lee Schick, Arvada, CO (US); Robert Matousek, Berthoud, CO (US); Sunil Anuprasad Patel, Longmont, CO (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/682,354

(22) Filed: Aug. 21, 2017

(65) Prior Publication Data
US 2019/0059161 A1    Feb. 21, 2019

(51) Int. Cl.
| | |
|---|---|
| G11B 33/12 | (2006.01) |
| H05K 3/34 | (2006.01) |
| G11B 5/48 | (2006.01) |
| H05K 1/02 | (2006.01) |
| H05K 1/16 | (2006.01) |
| H05K 1/18 | (2006.01) |

(52) U.S. Cl.
CPC ........... *H05K 3/3442* (2013.01); *G11B 5/486* (2013.01); *G11B 5/4846* (2013.01); *G11B 33/12* (2013.01); *G11B 33/122* (2013.01); *H05K 1/0231* (2013.01); *H05K 1/162* (2013.01); *H05K 1/181* (2013.01); *H05K 1/185* (2013.01); *H05K 2201/10636* (2013.01)

(58) Field of Classification Search
CPC .............................. G11B 33/12; G11B 33/122
USPC ............................................. 360/99.23, 99.25
See application file for complete search history.

(56) References Cited

U.S. PATENT DOCUMENTS

| | | | |
|---|---|---|---|
| 4,734,818 A | 3/1988 | Hernandez et al. | |
| 5,282,028 A * | 1/1994 | Johnson ................ | H03J 1/0025 348/E5.108 |
| 5,930,072 A * | 7/1999 | Shrinkle ................ | G11B 5/012 360/246 |
| 6,058,076 A * | 5/2000 | Komninos ............... | G01H 1/00 367/135 |
| 6,222,246 B1 | 4/2001 | Mak et al. | |
| 6,700,794 B2 | 3/2004 | Vinson et al. | |
| 8,304,854 B2 * | 11/2012 | Lee ......................... | H01G 2/06 257/532 |
| 2003/0081297 A1 * | 5/2003 | Hasegawa ............ | G02B 6/4201 398/202 |
| 2006/0122529 A1 * | 6/2006 | Tsau ................... | A61B 5/04004 600/544 |
| 2010/0142744 A1 * | 6/2010 | Rombach ............... | H04R 19/00 381/355 |
| 2013/0157482 A1 * | 6/2013 | Barber ................. | H05K 1/0231 439/88 |

(Continued)

*Primary Examiner* — Jefferson A Evans
(74) *Attorney, Agent, or Firm* — Holzer Patel Drennan

(57) ABSTRACT

A compact printed circuit board assembly includes a printed circuit board (PCB) and a preamplifier subassembly. The preamplifier subassembly includes a preamplifier and an insulating endcap abutting one another and arranged in a plane parallel to the PCB. An electrical via formed within the first insulating endcap provides an electrical connection between a decoupling capacitor and the PCB to reduce noise detectable in current flowing between the preamplifier and a current source.

18 Claims, 9 Drawing Sheets

(56) References Cited

U.S. PATENT DOCUMENTS

| | | | |
|---|---|---|---|
| 2014/0153746 A1* | 6/2014 | Nicollini | H03F 3/005 |
| | | | 381/120 |
| 2016/0195432 A1* | 7/2016 | Joo | G01J 1/44 |
| | | | 250/214 A |
| 2017/0012587 A1* | 1/2017 | Zhang | H03F 1/3205 |
| 2017/0219720 A1* | 8/2017 | Cortesi | G01T 1/205 |
| 2018/0102797 A1* | 4/2018 | Lim | H03M 9/00 |

* cited by examiner

COMPACT PRINTED CIRCUIT BOARD ASSEMBLY WITH INSULATING ENDCAP VIA

BACKGROUND

Consumer demands for microelectronics with decreased size and increased capability create ongoing design challenges for device manufacturers. A microelectronic device may include a number of components electrically coupled to a printed circuit board. For example, a printed circuit board may include a one or multiple chips as well as decoupling capacitors that help to reduce noise in signals sent to and from the chip. Chip surface area and the vast number of electrical leads carefully placed for connection to each individual component impose limits on the number and size of components that can be included.

SUMMARY

Implementations described and claimed herein provide a printed circuit board assembly (PCBA) including a preamplifier subassembly electrically coupled to a printed circuit board (PCB). The preamplifier subassembly includes an insulating endcap abutting a preamplifier. The preamplifier and the insulating endcap are arranged in a first plane parallel to the PCB, and the insulating endcap includes an electrical via that provides an electrical connection between a decoupling capacitor and the PCB to reduce noise detectable in current flowing between the preamplifier and a current source.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

These and various other features and advantages will be apparent from a reading of the following Detailed Description.

BRIEF DESCRIPTIONS OF THE DRAWINGS

DETAILED DESCRIPTION

Figure 1:
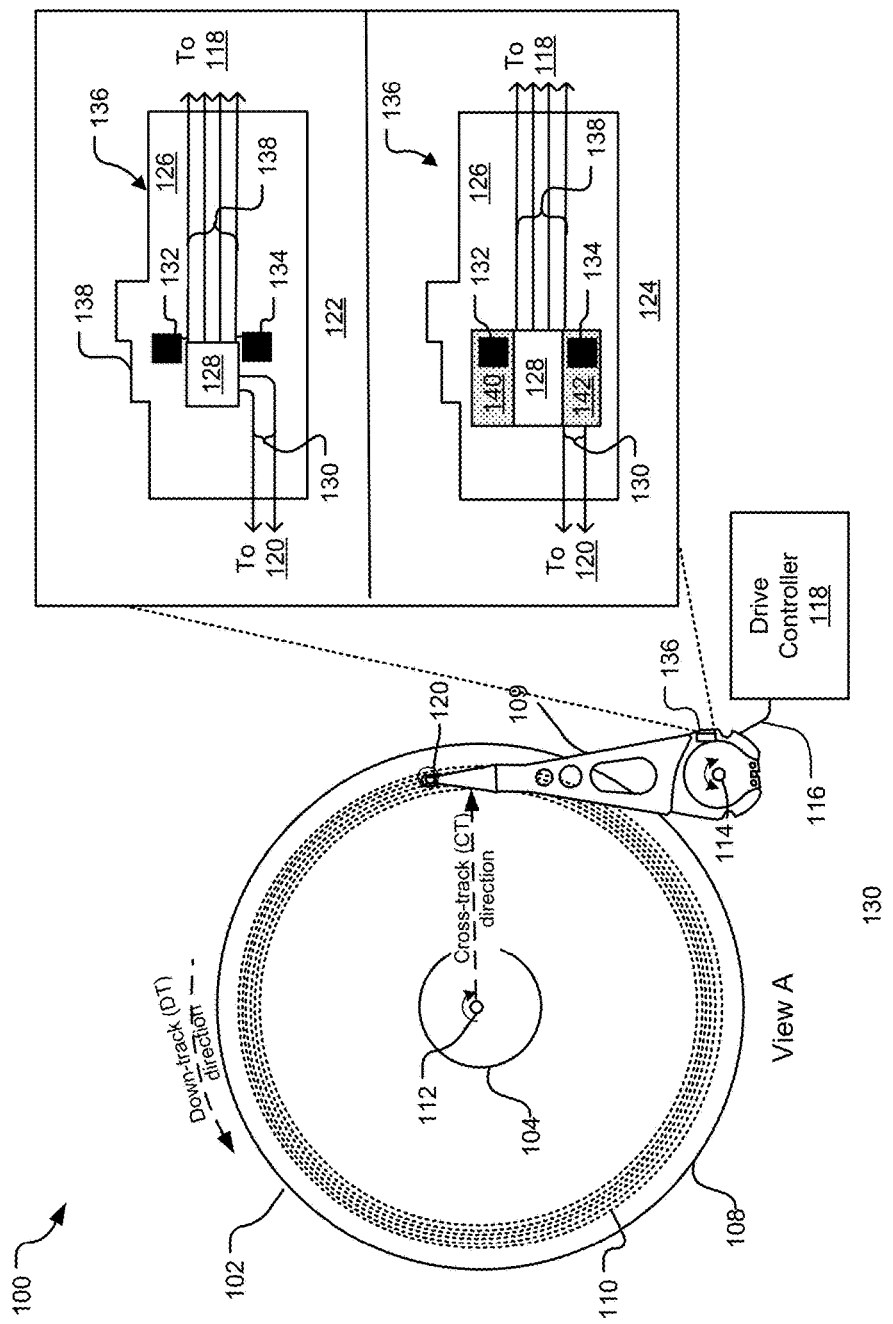
FIG. 1 illustrates an electronic device with a compact printed circuit board assembly (PCBA) design.

FIG. 1 illustrates an electronic device 100 with a printed circuit board assembly (PCBA 136) including microelectronic components attached using various techniques for compacting chip design. Although other implementations are contemplated, the example electronic device 100 is a data storage device including a transducer head assembly 120 for writing data to and reading data from a storage medium 108, such as a magnetic disk. As illustrated in View A, the storage medium 108 rotates about a spindle center or a disc axis of rotation 112 during rotation, and includes an inner diameter 104 and an outer diameter 102 between which are a number of concentric data tracks 110. Information may be written to and read from data bit locations in the data tracks on the storage medium 108.

The transducer head assembly 120 is mounted on an actuator assembly 109 at an end distal to an actuator axis of rotation 114. The transducer head assembly 120 flies in close proximity above the surface of the storage medium 108 during disc rotation. The actuator assembly 109 rotates during a seek operation about the actuator axis of rotation 112. The seek operation positions the transducer head assembly 120 over a target data track for read and write operations.

The transducer head assembly 120 includes at least one write element (not shown) that further includes a write pole for converting a series of electrical pulses sent from a controller 106 into a series of magnetic pulses of commensurate magnitude and length. The magnetic pulses of the write pole selectively magnetize magnetic grains of the rotating magnetic media 108 as they pass below the pulsating write element. The transducer head assembly 120 may further include a magnetoresistive read element (not shown) for reading stored data from the storage medium 108.

Movement of the actuator assembly 109 is effected by a voice coil motor (VCM) (not shown) according to power signals received across a flex cable 116 from a drive controller 118 (e.g., an SOC or ASIC). The flex cable 116 extends between the drive controller 118 and the PCBA 136, which is, in FIG. 1, shown mounted to an arm of the actuator assembly 109 near a pivot point for the actuator axis of rotation 114. In other implementations, the PCBA 136 may be located in different positions on the electronic device 100 and/or included within different types of electronic devices. The PCBA 136 includes a printed circuit board (PCB) 126 electrically connected to various attached microelectronic components. As used herein, the term "printed circuit board" or "PCB" is intended to refer to either a flexible or non-flexible printed circuit. A flexible printed circuit is, for example, a circuit that can be bent, folded, or twisted.

In the electronic device 100, the PCBA 136 includes a preamplifier 128 shown in exemplary PCBA layouts 122 and 124. The preamplifier 128 is effective to amplify signals sent to and/or received from the transducer head assembly 120 along various transmission lines 130.

The PCBA 136 further includes at least one decoupling capacitor, such as exemplary decoupling capacitors 132, 134 shown in each of the exemplary PCBA layouts 122 and 124. The decoupling capacitors 132, 134 function to reduce noise in signals that are amplified in transit between the drive controller 118 and the transducer head assembly 120. In general, decoupling capacitors (sometimes referred to as bypass capacitors) are used to filter DC power supply noise such as voltage spikes, voltage ripple, and to ensure that the current received at the preamplifier is unaffected by changes in voltage that may be momentarily observed on power supply lines from the drive controller 118. For example, rapid voltage changes along power supply lines to the preamplifier 128 may be observed when internal circuits of the drive controller 118 are switched on and off. To counteract these voltage changes and ensure a constant current level at the preamplifier, the one or more decoupling capacitors may discharge responsive to the voltage change to return the associated power supply line to its normal level.

In general, effectiveness of the decoupling capacitors 132, 134 increases with proximity to the preamplifier 128. From a design perspective, it is therefore desirable to place the decoupling capacitors 132 and 134 as close to the preamplifier 128 as possible. In some designs, placement options are limited by available real estate on the PCB 126, as the PCB 126 may also be designed to support a large number of traces, leads, etc. on the PCB 126 that are routed to fit around the decoupling capacitors 132 and 134. Placement options of the decoupling capacitors 132 and 134 are further limited by the fact that certain preamplifier packages (e.g., flip chip) may include a component-free "keep-out area" around the die for assembly purposes. In such cases, the decoupling capacitors may be placed on the PCB 126 just outside of the keep-out area, such as in the approximate manner shown by example PCBA layout 122.

In the example PCBA layout 122, the preamplifier 128 and the decoupling capacitors 132 and 134 are arranged in a same plane, adjacent to one another, and each directly attached to the underlying PCB 126. For example, the decoupling capacitors 132 and 134 are soldered to leads formed on the of the PCB 126 that electrically couple to power transmission lines 138 extending between the preamplifier 128 and the drive controller 118. In this arrangement, the decoupling capacitors 132 and 134 consume real estate on the PCB 126, limiting the viability of using the same the PCBA 136 to support other microelectronics, such as additional preamplifiers in storage devices with multiple storage media and separate actuator arms for reading and writing data to each storage media.

In contrast to the exemplary PCBA layout 122, the exemplary PCBA layout 124 shows the preamplifier 128 adjacent to insulating endcaps 140 and 142. The decoupling capacitors 132, 134 are formed on top of the insulating endcaps 140 and 142 and coupled to the PCB 126 by way of electrical vias (not shown) tunneling through each of the insulating endcaps 140 and 142. By re-locating the decoupling capacitors 132, 134 to the insulating endcaps 140 and 142 as shown, space is saved on the PCB 126 because various microelectronics need not be routed around the decoupling capacitors 132 and 134. For example, various traces, leads, etc. may still be located below the insulating endcaps 140 and 142 and above the PCB 126, including at least some area directly underlying a part of the decoupling capacitors 132 or 134. Various manufacturing techniques facilitating this and similar layouts are described in greater detail with respect to the following figures.

Figure 2:
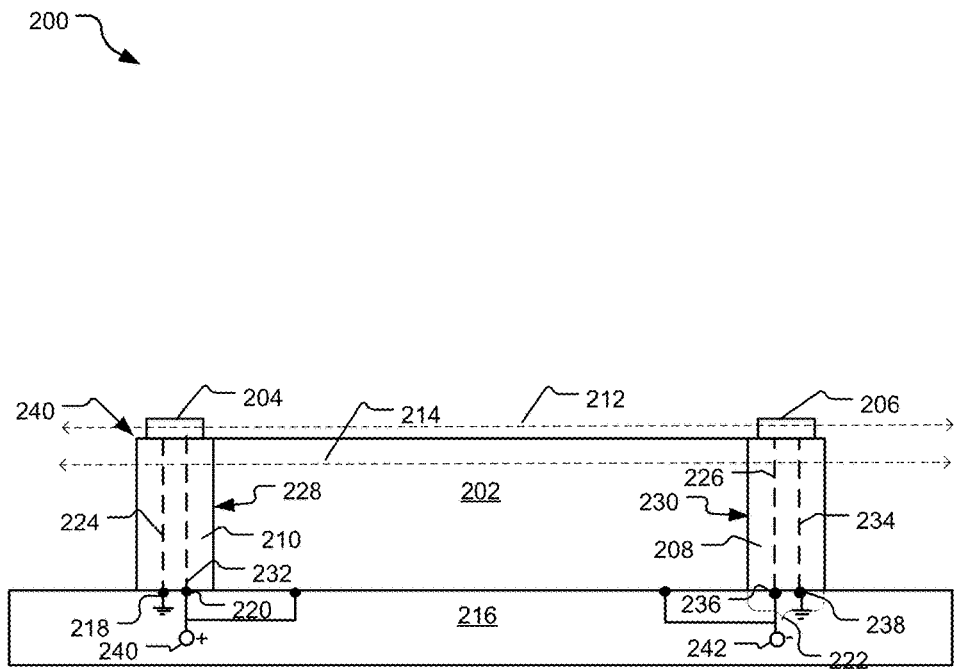
FIG. 2 illustrates a side view of a preamplifier assembly including a preamplifier and decoupling capacitors mounted on a PCB.
Figure 2:
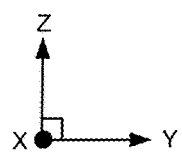

FIG. 2 illustrates a side view of a PCBA 200 including a preamplifier assembly 240 attached to a PCB 216. The preamplifier subassembly 240 has compact design features that effectively decrease the amount of surface area on the PCB 216 dedicated to supporting functionality of the preamplifier subassembly 240. The preamplifier assembly 240 includes a preamplifier 202, insulating endcaps 208 and 210, and decoupling capacitors 204 and 206. The preamplifier 202 and insulating endcaps 208 and 210 are arranged in a plane parallel to the PCB 216 with opposing surfaces 228 and 230 of the preamplifier 202 each abutting one of the insulating endcaps 210 and 208, respectively. The decoupling capacitors 204 and 206 are each arranged on top of a corresponding one of the insulating endcaps 208 or 210 and along an axis parallel to the PCB 216. The insulating endcaps 208 and 210 each include various channels 224, 232, 226, and 234 (also referred to herein as vias) that provide electrical connections between the decoupling capacitors 204 and 206, and a surface of the PCB 216 and/or the preamplifier 202. The channels 224 and 234 each connect an associated one of the decoupling capacitors 204 and 206 to an electrical ground on the PCB 216, while the channels 226 and 232 each connect an associated one of the decoupling capacitors 204 and 206 to an electrical pathway on the PCB 216 that flows current between a current source (e.g., a positive current source 240 and a negative current source 242) and the preamplifier 202. In this sense, the decoupling capacitors 204 and 206 can be discharged to counteract changes in current flowing from the current source (e.g., the positive current source 240 or the negative current source 242) and the preamplifier 202.

Figure 7:
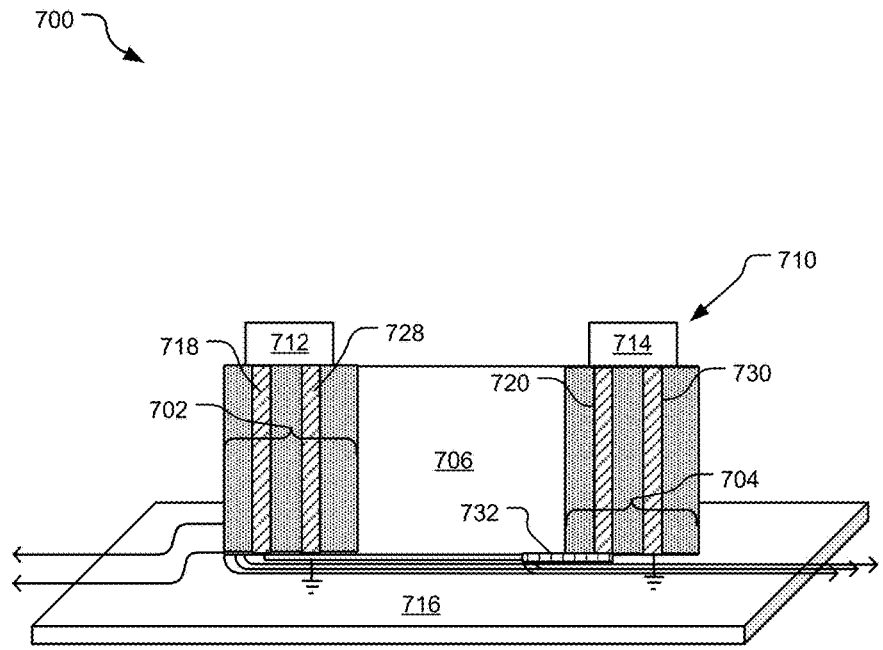
FIG. 7 illustrates a side-perspective view of another PCBA with a compact microelectronic component design.

In FIG. 2, the channels 226 and 232 provide indirect connections to the preamplifier 202 by way of electrical pathways on the PCB 216. In other implementations, the channels 226 and 232 connect directly to the preamplifier 202 (e.g., as shown in FIG. 7).

In FIG. 2, the decoupling capacitors 204 and 206 are arranged in a plane 212 above the preamplifier 202. In other implementations, the decoupling capacitors 204 and 206 are arranged in a plane that intersects the preamplifier 202, such as an example plane 214. In either case, the decoupling capacitors 204 and 206 are separated from the PCB 216 by a non-zero height (e.g., a height in the Z-direction of the example shown). Connection points formed by solder joints (e.g., connection points 218, 220, 236, and 238) complete electrical connections between the decoupling capacitors 204 and 206 and the PCB 216. In another implementation, such as that shown in FIG. 7, the electrical connections do not extend between the decoupling capacitors 204, 206 and the PCB 216. Rather, metal trace connections exist in a "redistribution layer" between the PCB 216 and the preamplifier 202 for connecting one or more of the electrical vias in the insulating endcaps 208 and 210 to the preamplifier 202. A cross sectional area of these connection points 218 and 220 (e.g., a cross-sectional area in the X-Y plane) is significantly smaller than a cross-sectional area of the decoupling capacitors 204 and 206 in the X-Y plane. As a result, there is ample room for various traces and other microelectronics on the PCB 216 in the regions between the PCB 216 and the insulating endcaps 208 and 210. For example, microelectronics may be included anywhere in the example region 222 except for the small area coinciding with the connection points 236 and 238.

Figure 3:
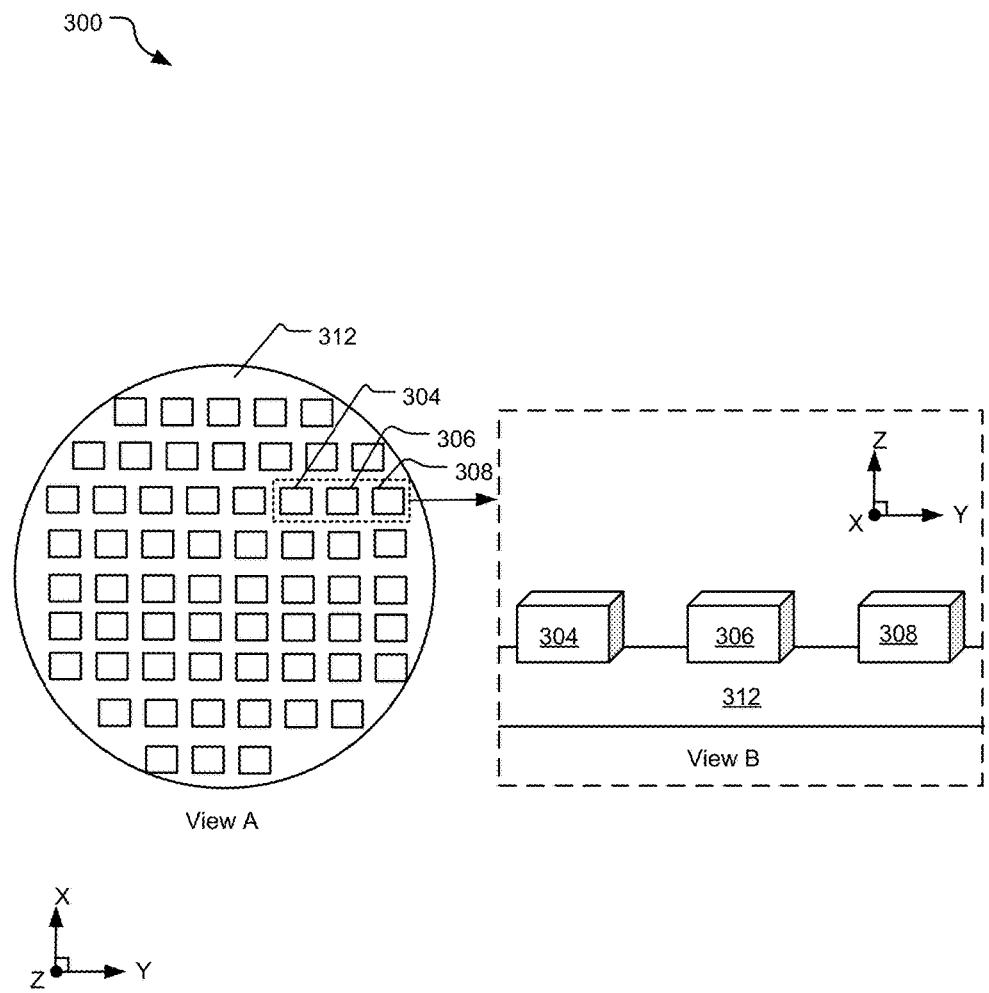
FIG. 3 illustrates an example early phase in a manufacturing an example PCBA including a preamplifier subassembly.

FIG. 3 illustrates an example early phase in a manufacturing various compact PCBAs, such as the example PCBA shown and described with respect to FIG. 2. Specifically, View A of FIG. 3 illustrates a top-down view of a wafer 300 including various preamplifiers (e.g., preamplifier 302, 304, 306) arranged on a temporary base support 312 (e.g., a silicon substrate). View B of FIG. 3 illustrates a side perspective view of a portion of the wafer 300 indicated by the dotted rectangle in view A.

Figure 4:
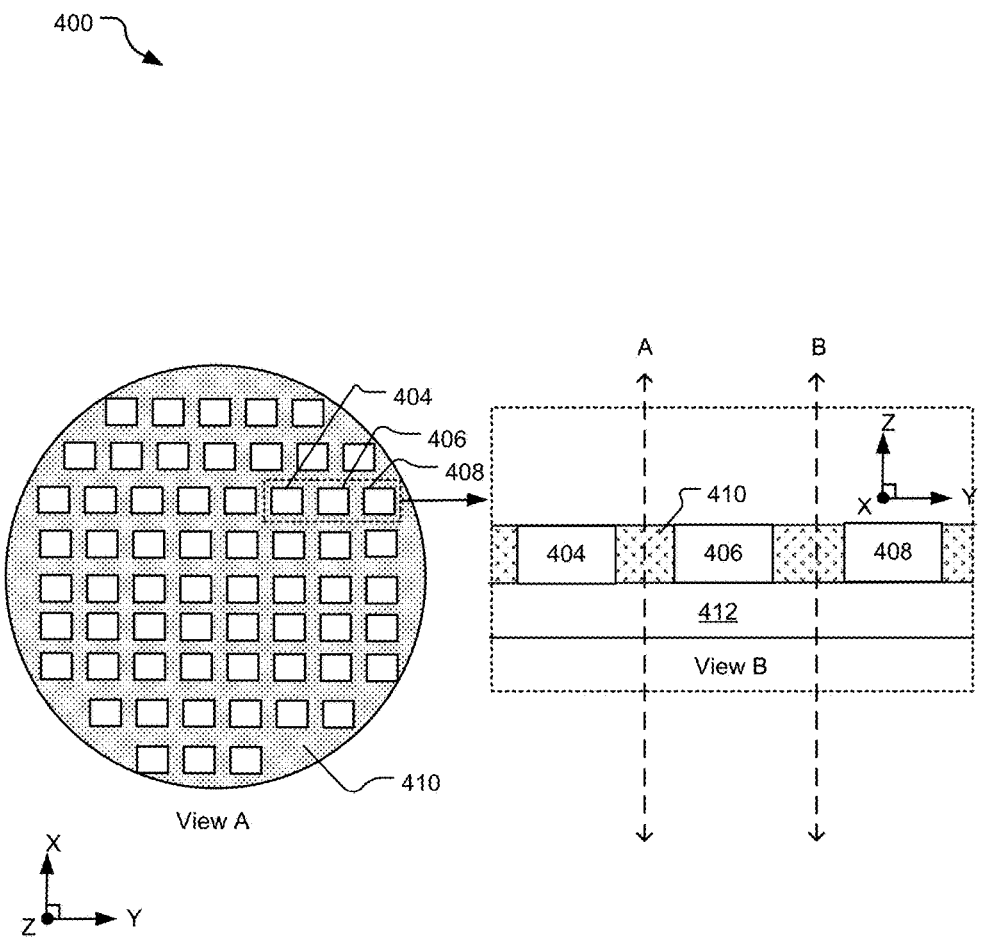
FIG. 4 illustrates another phase in a manufacturing an example compact PCBA with a preamplifier subassembly subsequent to the phase shown in FIG. 3.

FIG. 4 illustrates another phase in a manufacturing various compact PCBAs subsequent to the phase shown in FIG. 3. Specifically, view A of FIG. 4 illustrates a top-down view of a structure 400 including various preamplifiers (e.g., preamplifiers 402, 404, and 406) that have been encased by a layer of insulating material 410, such as an electronic mold compound (EMC), liquid epoxy, or other insulating material in which vias can be formed, such as a by mechanical or laser drilling or electrochemical etching. For example, a deposition step (e.g., physical vapor deposition, spin-coating) is performed to coat the structure 400 and to fill areas between the preamplifiers (e.g., the preamplifiers 402, 404, 406) with the insulating material 410.

View B of FIG. 4 illustrates a side perspective view of a portion of the structure 400 including the preamplifiers 404, 406, and 406. The layer of insulating material 410 is shown on top of a temporary base support 412. In one implementation, the preamplifiers 404, 406, and 408 have a z-direction height that is approximately equal to a z-direction height of the insulating material 410. In this case, the backside of each of the preamplifiers is exposed to an external surrounding environment. This may be achieved, for example, by using a photoresist to create a temporary protective mask over each of the preamplifiers during deposition of the insulating material. After the deposition, the mask can be removed. Other implementations may utilize various chemical or mechanical planarization techniques to fine-tune the height of the layer of insulating material 410 relative the preamplifiers 402, 404, and 406. In another implementation, the preamplifiers 404, 406, and 408 have a z-direction height that is less than the insulating material 410.

Following deposition of the insulating material 410, the structure 400 is sliced to create a number of microelectronic components each including one or more of the preamplifiers. For example, the structure 400 may be sliced along the axes A and B that are shown in FIG. 4.

Figure 5A:
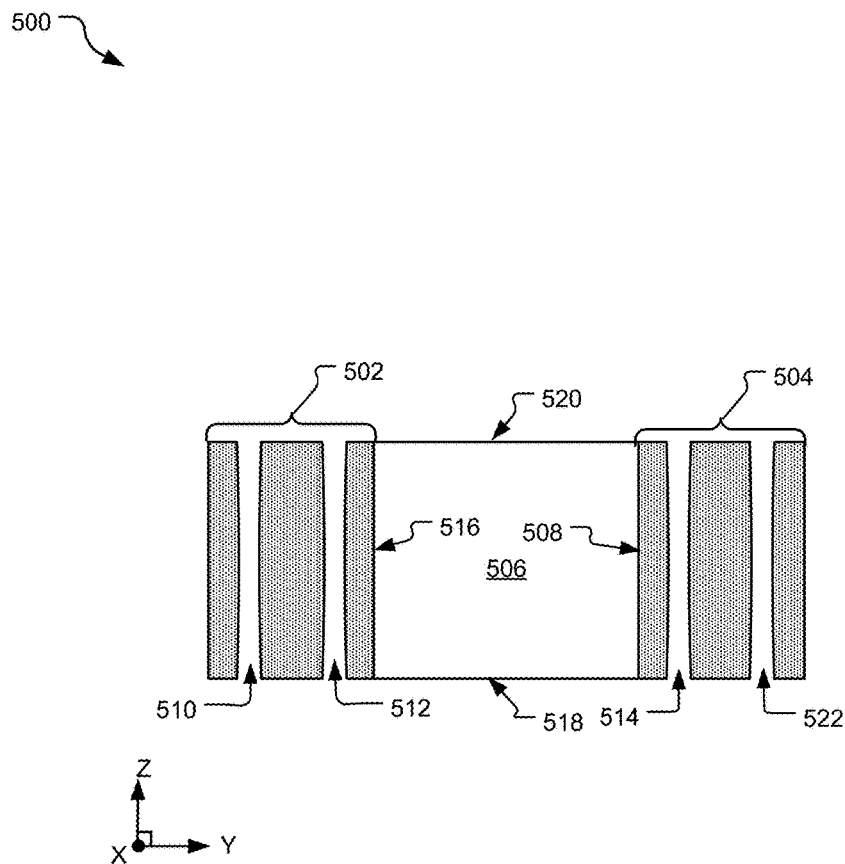
FIG. 5A illustrates a cross-sectional view of a preamplifier assembly.
Figure 5B:
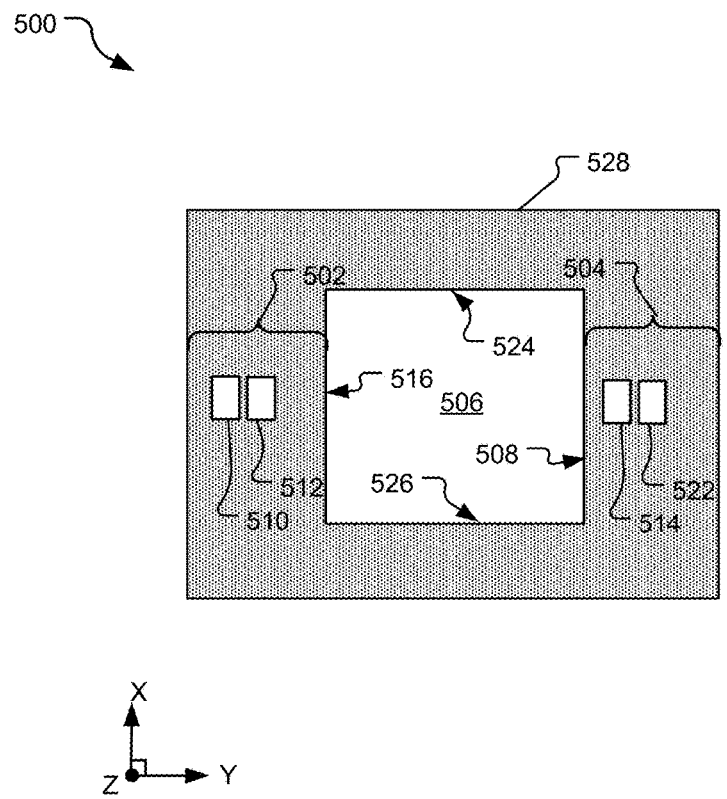
FIG. 5B illustrates a top-down view of the preamplifier assembly of FIG. 5A.

FIG. 5A illustrates a cross-sectional view of a preamplifier assembly 500 during another phase of manufacturing. In one implementation, the preamplifier assembly 500 is created by mechanically separating a microelectronic component structure (e.g., the structure 400 of FIG. 4) along various axes (e.g., Axes A and B as shown in FIG. 4) to create multiple discrete structures each including one or more microelectronic components. A temporary base support layer (e.g., the temporary base support 412 in FIG. 4) is removed (e.g., either before or after the slicing), leaving behind a free-standing structure including a preamplifier 506 encapsulated encased by an insulating material. Since FIG. 5 illustrates a two-dimensional cross-sectional view, the encapsulating material appears as two separate insulating endcaps 502 and 504. However, it may be understood that the preamplifier includes two additional side surfaces (not shown) that are also encapsulated in the insulating material (e.g., side surfaces that extend within the Z-Y plane between a bottom surface 518 and a top surface 520 and are separated from one another along the X-axis). In one implementation, all four side surfaces (e.g., 508, 516, and the two sides not shown in FIG. 5) are all encapsulated by insulating material of the insulating endcaps 502 and 504. For example, the insulating material may form a four-sided barrier that wraps around the four sides of the preamplifier 506 (e.g., as shown in FIG. 5B) that extend between the bottom surface 518 and the top surface 520. In one implementation, the insulating endcaps 502 and 504 are made of EMC.

After separating the preamplifier assembly 500 from the wafer and removing the temporary base substrate, a number of conductive through-holes (e.g., 510, 512, 514 and 522) are formed in the insulating endcaps 502 and 504. For example, the through-holes 510, 512, 514, and 522 are laser-drilled or formed mechanically. In one implementation, the through-holes 510, 512, 514, and 522 are subsequently filed with an electrically-conductive material (e.g., copper), such as by a screen-print or electrodeposition method. The electrically-conductive material within the through-holes 510, 512, 514, and 522 facilitates electrical connections between decoupling capacitors and a PCB or, in some implementations, the preamplifier 506.

FIG. 5B illustrates a top-down view of the preamplifier assembly 500 also shown in FIG. 5A. In this view, the insulating endcaps 502 and 504 are shown as different portions of an insulating sidewall 528 that encapsulates four side surfaces (508, 516, 524, 526) of the preamplifier 506. The two pairs of through-holes 510, 512 and 514, and 522 are created adjacent to the opposing side surfaces 516 and 508 of the preamplifier 506, respectively. In some implementations, additional through-holes are formed in the insulating sidewall 528, such as adjacent to the side surface 524 and 526. Each of the formed through-holes is subsequently filled with an electrically conductive material so as to provide an electrical connection that extends perpendicularly upward (in the z-direction) from a plane of an underlying PCB (not shown). In some implementations, the insulating material is removed in regions adjacent to one or more of the side surfaces 508, 516, 526, and 524 prior to attachment of the preamplifier subassembly 500 to a PCB. In other implementations, all four side surfaces (e.g., 508, 516, 524, and 526) remain encapsulated by the insulating material (e.g., as shown) in a final product including the preamplifier subassembly 500.

Figure 6:
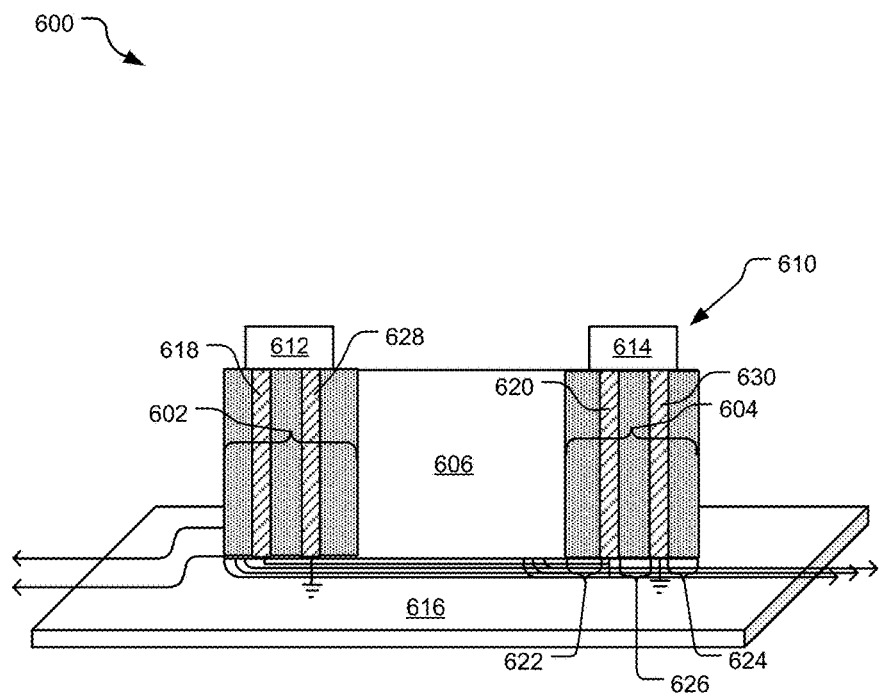
FIG. 6 illustrates a side-perspective view of a PCBA with a compact microelectronic component design.
Figure 6:
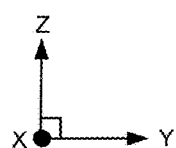

FIG. 6 illustrates a side-perspective view of a PCBA 600 with a compact component design. The PCBA 600 includes a preamplifier assembly 610 attached to a PCB 616. The preamplifier assembly 610 further includes a preamplifier 606 with opposing side surfaces abutting insulating endcaps 602 and 604. Decoupling capacitors 612 and 614 are each arranged on a surface of one of the insulating endcaps 602 and 604 that is parallel to and faces away from a primary plane of the PCB 616 (e.g., the x-y plane). Electrical connections 618, 628 extend through the decoupling capacitor 602 while electrical connections 620 and 630 extend through the decoupling capacitor 630. Specifically, the electrical connections 628 and 630 are grounded on the PCB 616, while the electrical connections 618 and 620 connect to power lines on the PCB 616 that also supply current to the preamplifier. As a result of this arrangement, the decoupling capacitors 612 and 614 can discharge current along the electrical connections 618 and/or 620 to effectively mitigate changes in current flow observable at the preamplifier 202 along respective power lines.

For example, the electrical connections 618 and 620 are formed by a screen-print or electrodeposition methods that fills through-holes (e.g., 510 and 512 of FIG. 5A) with an electrically conductive material. Subsequently, the electrically conductive material is soldered in regions above and below the insulating endcaps 602 and 604 to form solder joints (e.g., not shown) to adjacent components.

By attaching the decoupling capacitors 612 and 614 to the top surface of the insulating endcaps 602 and 604 (e.g., as shown) space is saved on the PCB 616 because various microelectronics and transmission lines may still be located on the PCB 616 in regions between below the insulating endcaps 602, 604. For example, regions 622, 624, and 626 include surface area on the PCB 616 underlying the insulating endcap 604 that may be used to support additional electronics such as those that operate completely independent of the preamplifier assembly 610.

FIG. 7 illustrates a side-perspective view of a PCBA 700 with another compact component design. The PCBA 700 includes a preamplifier assembly 710 attached to a PCB 716. The preamplifier assembly 710 further includes a preamplifier 706 with opposing side surfaces abutting insulating endcaps 702 and 704. Decoupling capacitors 712 and 714 are each arranged on an upper surface of one of the insulating endcaps 702 and 704 that is parallel to and faces away from the PCB 716. The insulating endcap 702 includes electrical vias 718, 720, 728, and 730 which extend vertically through the insulating endcap 702 in a direction generally perpendicular to the PCB 716 to connect one of the decoupling capacitors 712 and 714 to power and ground.

In some implementations, such as that shown in FIG. 2, the electrical vias 718, 720, 728 and 730 connect to the PCB 716 directly (e.g., with solder connections). For example, a solder connection completes an electrical pathway between each one of the electrical vias 718, 720, 728, and 730 and a corresponding trace on the PCB 716. These traces may extend to ground, power, and/or leads on the preamplifier 706.

In contrast, FIG. 7 shows an alternative connection that facilitates direct current flow between the decoupling capacitor 714 and the preamplifier 706 without utilizing traces on the PCB 716. In FIG. 7, the electrical via 720 is shown connecting to the preamplifier 706 by way of a redistribution layer 732 that is interleaved between the preamplifier assembly 710 and PCB 716. In one implementation, the redistribution layer 732 includes dielectric material embedding one or more metal traces (e.g., copper) positioned so as to complete electrical connections between leads on the preamplifier 706 and one or more of the electrical vias 718, 720, 728 and 730 (e.g., the electrical via 720 in FIG. 7). The redistribution layer 732 may, for example, be formed on the preamplifier assembly 710 prior to the attachment of the preamplifier assembly 710 to the PCB 716. Although the redistribution layer 732 is shown connecting to one of the electrical vias (e.g., the electrical via 720), the redistribution layer may, in other implementations, be of larger size to facilitate multiple connections to the preamplifier 706 and/or include multiple separated segments (e.g., a first segment to supply electrical connections to the first insulating endcap 702 and a second segment to supply electrical connections to the second insulating endcap 704).

Figure 8:
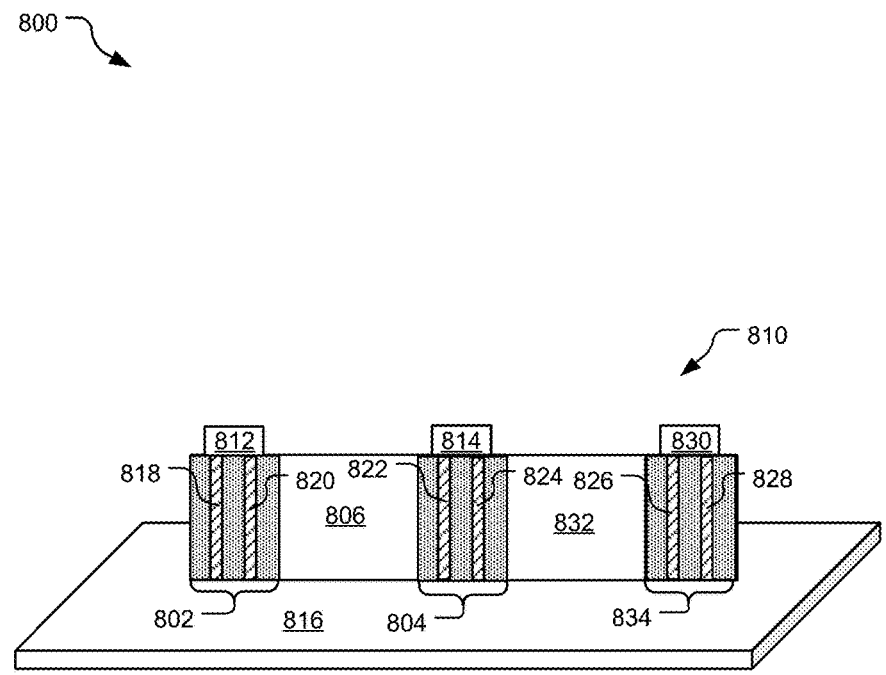
FIG. 8 illustrates a side-perspective view of yet another PCBA with a compact microelectronic component design.

FIG. 8 illustrates another a side-perspective view of another PCBA 800 with a compact layout of microelectronic components. The PCBA 800 includes a PCB 816 attached to a preamplifier assembly 810 that includes multiple preamplifiers (e.g., preamplifiers 806 and 832). The preamplifier assembly 810 includes multiple insulating endcaps (e.g., insulating endcaps 802, 804, and 834). Each one of the insulating endcaps includes a pair of electrical vias (e.g. pairs 818 and 820; 822 and 824; and 826 and 828) creating electrical connections between the PCB 816 and one of the decoupling capacitors 812, 814, and 830. In some implementations, one or more of the electrical vias 818, 820, 822, 824, 826, and 828 creates an electrical connection between one of the decoupling capacitors 812, 814, and 830 and an adjacent preamplifier (e.g., 806 or 832) rather than the PCB 816, such as by way of a redistribution layer (e.g., such as the redistribution layer 732 described with respect to FIG. 7).

In one implementation, the preamplifier assembly 810 is formed as a single monolithic component prior to attachment to the PCB 816. For example, a plurality of preamplifiers is arranged on a wafer (e.g., as shown in FIG. 3) and an insulating material, such as EMC is deposited over the wafer to fill the spaces between the preamplifiers, such as in the matter shown and described with respect to FIG. 4. A temporary support base is then removed and the remaining structure is sliced such that each slice includes at least a pair of adjacent preamplifiers. In some implementations, each slice includes three or more adjacent preamplifiers. Through-holes are created in the insulating material, and the through-holes are filled with electrically conductive material, such as described above with respect to FIGS. 5 and 6. The decoupling capacitors 812, 814, and 830 are then soldered to the electrically conductive material atop each of the insulating endcaps 802, 804, and 834. Additional solder is melted between the PCB 816 and the electrical vias 818, 820, 822, 824, 826, and 828 to attach the preamplifier assembly 810 the PCB 816.

Advantageously, the preamplifier assembly 810 allows for tighter proximity between each adjacent pair of preamplifiers than other existing solutions. For example, a method of bonding a stand-alone preamplifier to a PCB may entail melting a number of solder joints and backfilling remaining space between the preamplifier and the PCB with a filler material such as Lord ME588 thermoset encapsulant, an anhydride-free, semiconductor grade epoxy underfill product. A variety of other silica or glass filler may material may similarly be utilized. When this backfill technique is utilized, the filler material tends to create "tails" extending from opposing sides of the preamplifier. These tails serve to limit the proximity with to the preamplifier that another preamplifier can be subsequently attached to the same PCB.

The implementations of the invention described herein are implemented as logical steps in one or more computer systems. The logical operations of the present invention are implemented (1) as a sequence of processor-implemented steps executing in one or more computer systems and (2) as interconnected machine or circuit modules within one or more computer systems. The implementation is a matter of choice, dependent on the performance requirements of the computer system implementing the invention. Accordingly, the logical operations making up the embodiments of the invention described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A printed circuit board assembly comprising:
    a printed circuit board (PCB);
    a preamplifier subassembly electrically coupled to the PCB and further coupled to a read or write head, the preamplifier subassembly including:
        a preamplifier with a first surface abutting a first insulating endcap, the preamplifier and the first insulating endcap arranged in a first plane parallel to a primary plane of the PCB; and
        an electrical via formed within the first insulating endcap and providing an electrical connection between a first decoupling capacitor and at least one of the PCB and the preamplifier to reduce noise detectable in current flowing between the preamplifier and a current source.

2. The printed circuit board assembly of claim 1, wherein the preamplifier subassembly includes at least two preamplifiers arranged in the first plane and positioned in contact with opposing surfaces of the first insulating endcap.

3. The printed circuit board assembly of claim 1, wherein the first decoupling capacitor is arranged in a second plane parallel to the PCB and the first plane, the first decoupling capacitor aligned with the first insulating endcap and the PCB along an axis perpendicular to the first plane.

4. The printed circuit board assembly of claim 3, wherein the first insulating endcap abuts a first surface of the preamplifier and a second insulating endcap abuts a second opposite surface of the preamplifier, the second insulating endcap including an electrical via coupling the PCB to a second decoupling capacitor arranged in the second plane.

5. The printed circuit board assembly of claim 4, wherein the first decoupling capacitor and the second decoupling capacitor are arranged in a second plane parallel to the first plane and the PCB.

6. The printed circuit board assembly of claim 1, wherein the first decoupling capacitor couples to the preamplifier through a redistribution layer.

7. The printed circuit board assembly of claim 1, wherein the PCB and the preamplifier subassembly are coupled to one another and positioned on an actuator arm and the first decoupling capacitor reduces noise between the preamplifier and at least one read or write head.

8. The printed circuit board assembly of claim 1, wherein the first insulating endcap separates the first decoupling capacitor from underlying electrical connections formed on the PCB.

9. A method comprising:
attaching a printed circuit board (PCB) to a preamplifier subassembly including a preamplifier abutting a first insulating endcap, the first insulating endcap including an electrical via providing an electrical connection between a first decoupling capacitor and at least one of the PCB and the preamplifier to reduce noise detectable in current flowing between the preamplifier and a current source, the preamplifier and the first insulating endcap arranged in a first plane parallel to a primary plane of the PCB, the preamplifier providing current to a read or write head.

10. The method of claim 9, wherein the preamplifier subassembly includes at least two preamplifiers arranged in the first plane and separated from one another by the first insulating endcap.

11. The method of claim 9, wherein the first decoupling capacitor is arranged in a second plane parallel to the PCB and the first plane, the first decoupling capacitor aligned with the first insulating endcap and the PCB along an axis perpendicular to the PCB.

12. The method of claim 9, wherein the first insulating endcap includes an epoxy molded compound (EMC).

13. The method of claim 9, further comprising:
arranging a plurality of preamplifiers on a wafer;
depositing an insulating material over the plurality of preamplifiers to form an insulating layer encapsulating the preamplifiers; and
separating the wafer into different structures, each structure including at least one of the preamplifiers with opposing surfaces encased in the insulating material.

14. The method of claim 9, wherein the first insulating endcap abuts a first surface of the preamplifier and a second insulating endcap abuts a second opposite surface of the preamplifier, the second insulating endcap including an electrical via coupling the PCB to a second decoupling capacitor arranged in the first plane.

15. The method of claim 14, wherein the first decoupling capacitor and the second decoupling capacitor are arranged in a second plane parallel to the first plane and the PCB.

16. The method of claim 9, wherein the PCB and the preamplifier subassembly are positioned on an actuator arm and the first decoupling capacitor reduces noise between the preamplifier and at least one read or write head.

17. The method of claim 9, wherein the first insulating endcap separates the first decoupling capacitor from underlying electrical connections formed on the PCB.

18. A printed circuit board assembly comprising:
a printed circuit board (PCB);
a preamplifier subassembly electrically coupled to the PCB and including at least a first preamplifier and a second preamplifier arranged in a second plane parallel to a primary plane of the PCB, the first preamplifier and the second preamplifier separated from one another by a first insulating endcap including an electrical via that provides an electrical connection between a decoupling capacitor and at least one of the PCB and the preamplifier to reduce noise detectable in current flowing between a current source and at least one of the first preamplifier or the second preamplifier.

* * * * *